United States Patent
Zeng et al.

(10) Patent No.: US 12,411,403 B2
(45) Date of Patent: Sep. 9, 2025

(54) METHOD OF MAKING A HARD DISK DRIVE WRITE POLE USING A TRI-TONE ATTENUATED PHASE SHIFT MASK

(71) Applicant: WESTERN DIGITAL TECHNOLOGIES, INC., San Jose, CA (US)

(72) Inventors: Xianzhong Zeng, Saratoga, CA (US); Yi Zheng, San Ramon, CA (US); Ming Jiang, San Jose, CA (US); Donald G. Allen, Morgan Hill, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 579 days.

(21) Appl. No.: 17/871,297

(22) Filed: Jul. 22, 2022

(65) Prior Publication Data

US 2024/0027892 A1 Jan. 25, 2024

(51) Int. Cl.
*G03F 1/32* (2012.01)
*G11B 5/31* (2006.01)

(52) U.S. Cl.
CPC .............. *G03F 1/32* (2013.01); *G11B 5/3116* (2013.01)

(58) Field of Classification Search
CPC ....... G03F 1/32; G11B 5/3116; G11B 5/1278; G11B 5/3163
See application file for complete search history.

(56) References Cited

U.S. PATENT DOCUMENTS

| | | | |
|---|---|---|---|
| 7,425,393 B2 * | 9/2008 | Nakagawa | G03F 1/28 430/5 |
| 7,565,732 B2 | 7/2009 | Le et al. | |
| 7,604,910 B2 * | 10/2009 | Kamijima | G03F 1/36 430/311 |
| 7,736,823 B1 * | 6/2010 | Wang | G11B 5/3116 430/5 |
| 7,910,267 B1 * | 3/2011 | Zeng | G03F 1/36 430/5 |
| 8,291,743 B1 | 10/2012 | Shi et al. | |

(Continued)

OTHER PUBLICATIONS

U.S. Appl. No. 17/588,758, filed Jan. 31, 2022, Western Digital Technologies, Inc.

*Primary Examiner* — Stewart A Fraser
(74) *Attorney, Agent, or Firm* — PATTERSON + SHERIDAN, LLP

(57) ABSTRACT

A write pole of a write head of a hard disk drive can be manufactured by forming a photoresist layer over a magnetic material layer located over a substrate, disposing a tri-tone lithographic mask over the photoresist layer, lithographically exposing the photoresist layer through the lithographic mask, developing the photoresist layer to form a patterned photoresist layer, and patterning the magnetic material layer into the write pole by removing portions of the magnetic material layer that are not covered by the photoresist layer. The tri-tone lithographic mask includes a patterned opaque material layer and a patterned partially-transparent material layer located over a transparent substrate. The patterned opaque material layer includes a uniform width region and a flare region. The patterned partially-transparent material layer includes a pair of partially-transparent strips extending adjacent to a respective edge of the patterned opaque material layer, and partially-transparent assist bars.

20 Claims, 14 Drawing Sheets

(56) References Cited

U.S. PATENT DOCUMENTS

| | | |
|---|---|---|
| 8,361,541 B2 | 1/2013 | Lee et al. |
| 8,443,510 B1 | 5/2013 | Shi et al. |
| 8,717,709 B1 | 5/2014 | Shi et al. |
| 8,735,565 B2 | 5/2014 | Poyart et al. |
| 8,964,333 B1 | 2/2015 | Hu et al. |
| 9,153,261 B1 | 10/2015 | Kerner et al. |
| 9,321,146 B1 | 4/2016 | Rudy et al. |
| 9,390,733 B2 | 7/2016 | Etoh et al. |
| 10,460,750 B1 | 10/2019 | Zhang et al. |
| 10,714,125 B2 | 7/2020 | Zhang et al. |
| 10,755,733 B1 | 8/2020 | Zheng et al. |
| 2004/0074868 A1 | 4/2004 | Chang |
| 2004/0097173 A1 | 5/2004 | Crawforth et al. |
| 2007/0230063 A1 | 10/2007 | Seagle |
| 2007/0298353 A1 | 12/2007 | Yamamoto et al. |
| 2011/0212388 A1 | 9/2011 | Du et al. |
| 2011/0294398 A1 | 12/2011 | Hu et al. |
| 2015/0260757 A1 | 9/2015 | Li et al. |

\* cited by examiner

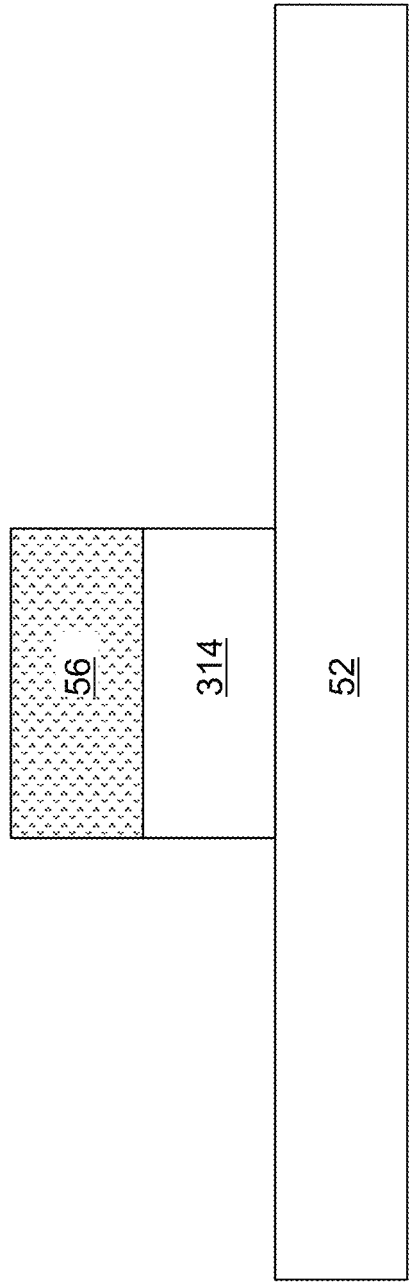

METHOD OF MAKING A HARD DISK DRIVE WRITE POLE USING A TRI-TONE ATTENUATED PHASE SHIFT MASK

FIELD

The present disclosure relates generally to the field of manufacture of hard disk drives, and particularly to using a tri-tone attenuated phase shift mask for lithographic patterning of a write pole in a write head of a hard disk drive and methods for using the same.

BACKGROUND

Magnetic heads are employed to operate hard disk drives. A magnetic head can include a reading (i.e., read) head and a write (i.e., writing or recording) head. General structures and method of manufacture for prior art magnetic heads are disclosed, for example, in U.S. Patent Application Publication Nos. 2004/0097173 A1; 2007/0230063 A1; 2011/0294398 A1; and 2015/0260757 A1 and U.S. Pat. Nos. 8,291,743 B1; 8,361,541 B1; 8,443,510 B1; 8,717,709 B1; 8,735,565 B2; 8,964,333 B1; 9,153,261 B1; 9,321,146 B2; and 9,390,733 B2 the entire contents of which are incorporated herein.

SUMMARY

According to an aspect of the present disclosure, a method of manufacturing a write pole of a write head of a hard disk drive comprises forming a photoresist layer over a magnetic material layer located over a substrate, disposing a lithographic mask comprises a tri-tone mask including a patterned opaque material layer and a patterned partially-transparent material layer located over a transparent substrate, lithographically exposing the photoresist layer through the lithographic mask, developing the photoresist layer to form a patterned photoresist layer, and patterning the magnetic material layer into the write pole by removing portions of the magnetic material layer that are not covered by the patterned photoresist layer. The patterned opaque material layer comprises a uniform width region extending along a lengthwise direction and having a first uniform width, and a flare region adjoined to a first end of the uniform width region and having a variable lateral dimension along a direction that is perpendicular to the lengthwise direction of the uniform width region, wherein the patterned partially-transparent material layer comprises a pair of partially-transparent strips extending adjacent to a respective edge of the patterned opaque material layer, and partially-transparent assist bars that are laterally spaced from the pair of partially-transparent strips.

According to another aspect of the present disclosure, a tri-tone lithographic mask comprises a patterned opaque material layer and a patterned partially-transparent material layer located over a transparent substrate. The patterned opaque material layer comprises a uniform width region extending along a lengthwise direction and having a first uniform width, and a flare region adjoined to a first end of the uniform width region and having a variable lateral dimension along a direction that is perpendicular to the lengthwise direction of the uniform width region. The patterned partially-transparent material layer comprises a pair of partially-transparent strips extending adjacent to a respective edge of the patterned opaque material layer, and partially-transparent assist bars that are laterally spaced from the pair of partially-transparent strips; and each of the partially-transparent assist bars comprises a respective parallel segment that is parallel to the lengthwise direction of the uniform width region and a respective slanted segment that is parallel to a respective edge of the flare region.

BRIEF DESCRIPTION OF THE DRAWINGS

FIG. 7A is a schematic vertical cross-sectional view of the exemplary structure after patterning a write pole according to an embodiment of the present disclosure.

DETAILED DESCRIPTION

Figure 1A:
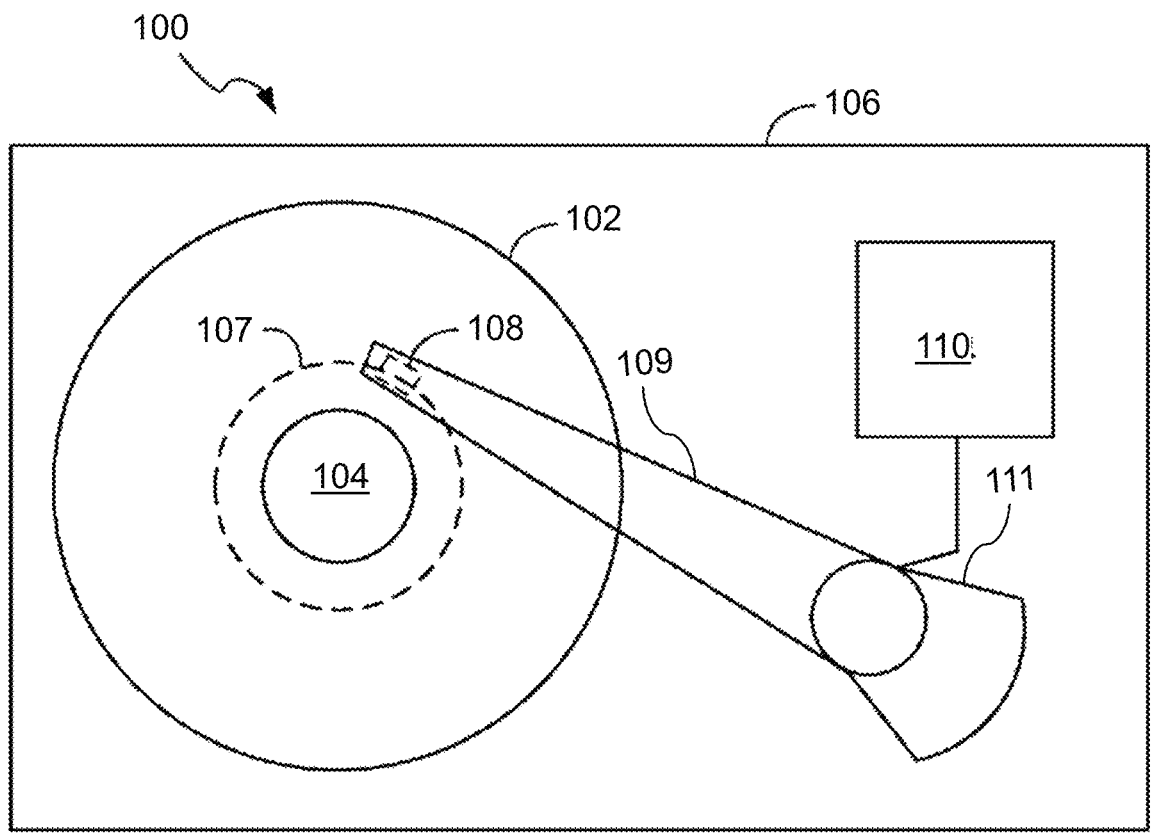
FIG. 1A is a top schematic view of a disk drive including a slider.

As described above, the present disclosure is directed to a tri-tone attenuated phase shift mask for lithographic patterning of a write pole in a write head of a hard disk drive and methods for using the same, the various aspects of which are described below in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Figure 1B:
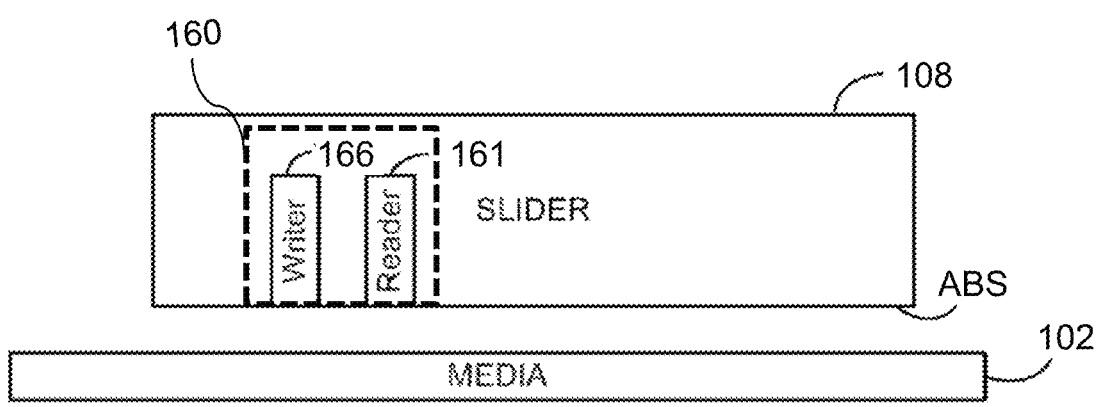
FIG. 1B is a side schematic view of the slider of FIG. 1A, which includes a magnetic head.

FIG. 1A is a top schematic view of a hard disk drive 300 including a slider 308 with a read head of an embodiment of the present disclosure. FIG. 1B is a side schematic view of the slider 108 of FIG. 1A and illustrates the magnetic head 160 of the embodiments of the present disclosure. The disk drive 100 may include one or more of the disks/media 102 configured to store data. The disks/media 102 reside on a spindle assembly 104 that is mounted to a drive housing 106. Data may be stored along tracks 107 in the magnetic recording layer of disk 102. The reading and writing of data is accomplished with the magnetic head 160 that incorporates both the read head (i.e., a reader or read sensor) 161 and a write head 166 (i.e., a writer, writing head or recording head). The slider 108 is part of a head-gimbal assembly (HGA) supported by one end of an actuator arm 109. The opposite end of the actuator arm 109 is connected to a head stack assembly (HSA) which may include a carriage and a voice coil motor 111. The write head 166 is used to alter the properties of the magnetic recording layer of disk 102 and thereby write information thereto. The read head 161 is used to read information stored on the magnetic recording layer of the disk 102.

The read head 161 and the write head 166 are disposed along an air bearing surface (ABS) or a gas bearing surface (GBS) of the slider 108. The ABS/GBS is the bottom surface of the slider 108, which is the slider surface that is the most proximate to the media 102. The separation distance between the ABS/GBS and the media 102 is self-limiting through the air or gas (e.g., helium) flow between the ABS/GBS and the read head 161 and/or the write head 166. In operation, a spindle motor (not shown) rotates the spindle assembly 104, and thereby rotates the disk 102 to position the magnetic head 600 containing the read head 161 and the write head 166 at a particular location along a desired disk track 107. The position of the read head 161 and/or the write head 166 relative to disk 102 may be controlled by a position control circuitry 110 which controls the HSA to move the actuator arm 109.

Figure 2:
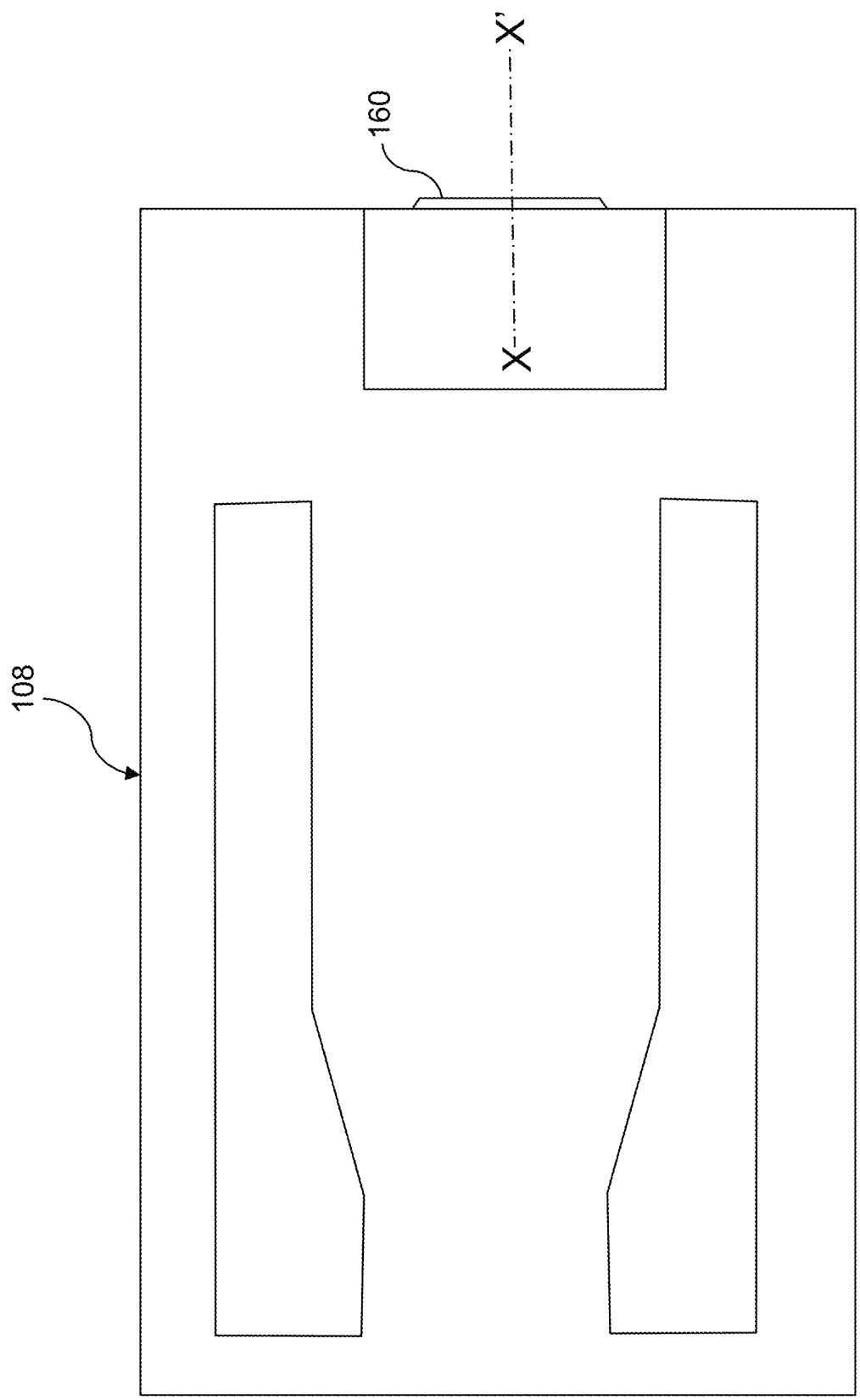
FIG. 2 is an ABS/GBS view of the slider of FIG. 1A, which illustrates the location of the magnetic head thereon.

Referring to FIG. 2, the orientation of the magnetic head 160 in a slider 108 can be seen in more detail. FIG. 2 is an ABS/GBS view of the slider 108. The magnetic head 160 includes an inductive write head and a read head (i.e., read sensor), is located at a trailing edge of the slider. Generally, disk storage systems may contain a large number of disks and actuators, and each actuator may support a number of sliders.

Figure 3:
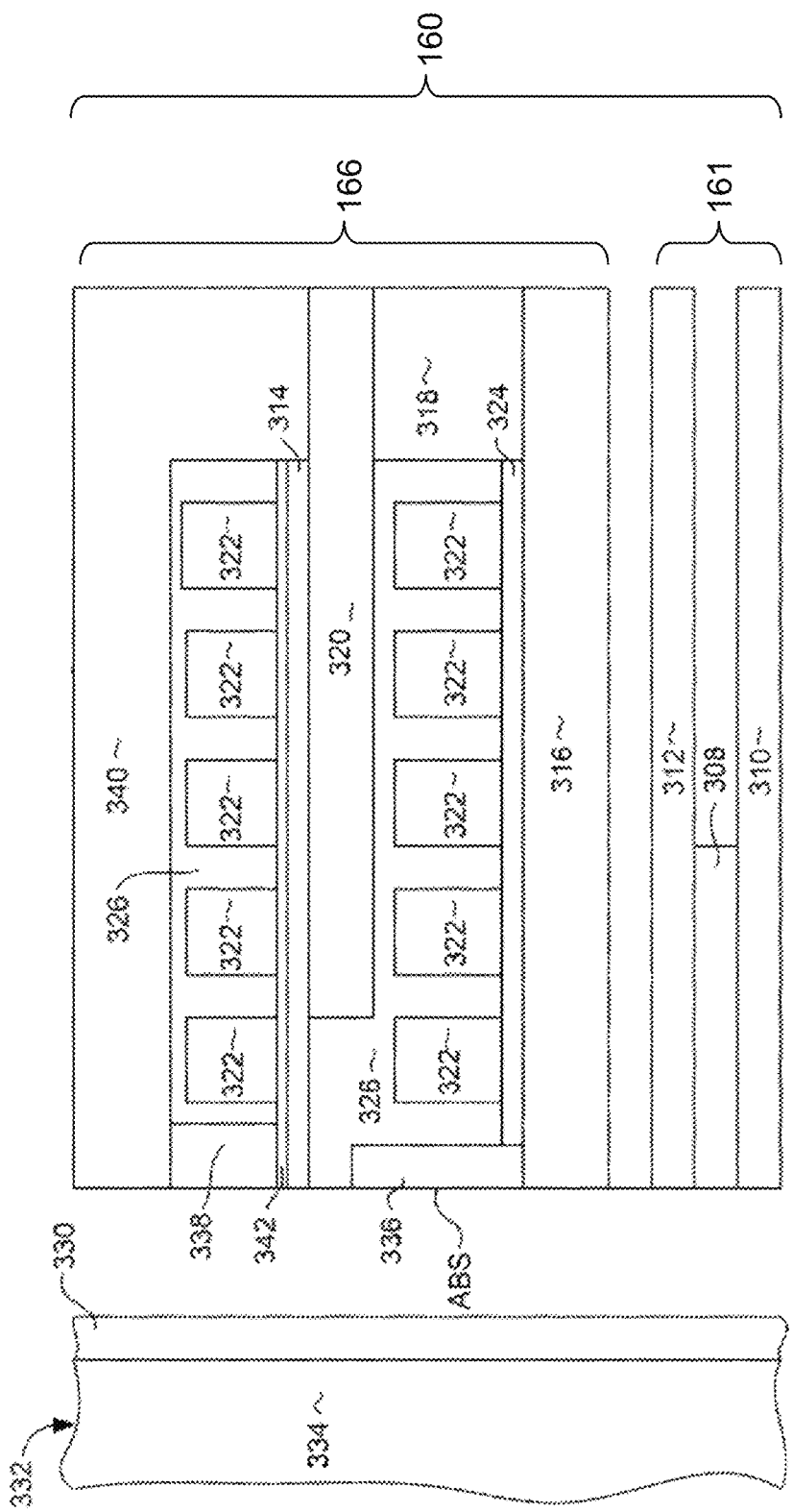
FIG. 3 is across sectional view of a magnetic head along the vertical plane X-X of FIG. 2.

Referring to FIG. 3 and according to an aspect of the present disclosure, the methods of the present disclosure can be employed to form the magnetic head 160. The magnetic head 160 includes the read head 161 and the write head 166. The read head 161 includes a magnetoresistive sensor 308, which can be a GMR, TMR, or some other type of sensor. The magnetoresistive sensor 308 is located between first and second magnetic shields (310, 312).

The write head 166 includes a magnetic write pole 314 and a magnetic return pole 316. The write pole 314 can be formed upon a magnetic shaping layer 320, and a magnetic back gap layer 318 magnetically connects the write pole 314 and shaping layer 320 with the return pole 316 in a region removed from the air bearing surface (ABS). A write coil 322 passes between the write pole and shaping layer 314, 320 and the return pole 316, and may also pass above the write pole 314 and shaping layer 320. The write coil 322 can be a helical coil or can be one or more pancake coils. The write coil 322 can be formed upon an insulation layer 324 and can be embedded in a coil insulation layer 326 such as alumina and or hard baked photoresist.

In operation, when an electrical current flows through the write coil 322, a resulting magnetic field causes a magnetic flux to flow through the return pole 316, back gap 318, shaping layer 320 and write pole 314. This causes a magnetic write field to be emitted from the tip of the write pole 314 toward a magnetic medium 332. The write pole 314 has a cross section at the ABS that is much smaller than the cross section of the return pole 316 at the ABS. Therefore, the magnetic field emitting from the write pole 314 is sufficiently dense and strong that it can write a data bit to a magnetically hard top layer 330 of the magnetic medium 332. The magnetic flux then flows through a magnetically softer under-layer 334, and returns back to the return pole 316, where it is sufficiently spread out and weak that it does not erase the data bit recorded by the write pole 314. A magnetic pedestal 336 may be provided at the air bearing surface ABS and attached to the return pole 316 to prevent stray magnetic fields from the bottom leads of the write coil 322 from affecting the magnetic signal recorded to the medium 332.

In order to increase write field gradient, and therefore increase the speed with which the write head 166 can write data, a trailing, wrap-around magnetic shield 338 can be provided. The trailing, wrap-around magnetic shield 338 is separated from the write pole by a non-magnetic trailing gap layer 339.

The trailing shield 338 attracts the magnetic field from the write pole 314, which slightly cants the angle of the magnetic field emitting from the write pole 314. This canting of the write field increases the speed with which write field polarity can be switched by increasing the field gradient. A trailing magnetic return pole 340 can be provided and can be magnetically connected with the trailing shield 338. Therefore, the trailing return pole 340 can magnetically connect the trailing magnetic shield 338 with the back portion of the write head 166, such as with the back end of the shaping layer 320 and with the back gap layer 318. The magnetic trailing shield is also a second return pole so that in addition to magnetic flux being conducted through the medium 332 to the return pole 316, the magnetic flux also flows through the medium 332 to the trailing return pole 340.

The trailing magnetic shield 338 is separated from the write pole 314 by a non-magnetic trailing gap layer 342 that can also be used to separate the upper portion of the coil 322 from the write pole 314. The trailing gap layer 342 can be constructed of a material such as alumina, Ru or some other non-magnetic material and has a thickness that is chosen to provide a sufficient increase in write field gradient while also minimizing the loss of write field to the trailing shield 338.

Figure 4:
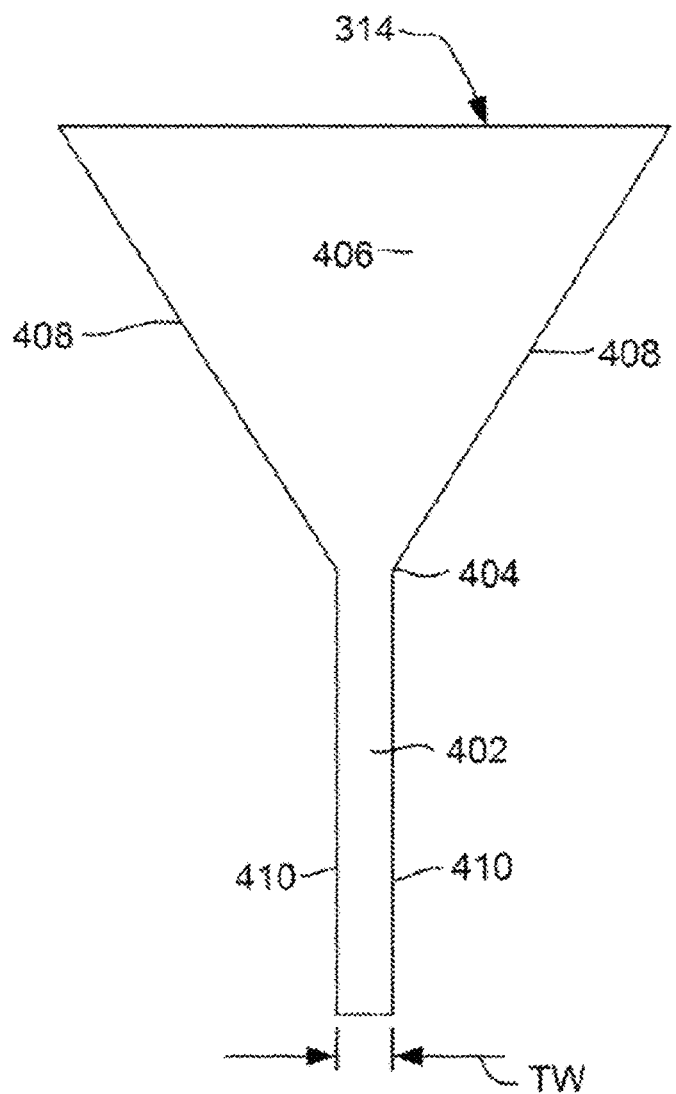
FIG. 4 is top-down view of a write pole of the magnetic write head of FIG. 3.

FIG. 4 shows a top-down view of the write pole 314. As can be seen, the write pole has a narrow pole tip portion 402 that extends to and terminates at the ABS/GBS, and has a flared portion 406. The junction between the narrow pole tip portion 402 and the flared region 406 defining a flare point 404. The pole tip portion 402 has sides 410 that are substantially parallel with one another and perpendicular to the ABS/GBS. Therefore, the pole tip portion 402 has a substantially constant width from the ABS/GB S to the flare point 404. The flared portion 406, however has sides 408 that are not parallel with one another, and which flare out to form an angle of, for example 30-60 degrees relative to the ABS/GBS. The flared portion 406, therefore does not have a constant width, but has a width that increases with increasing distance from the ABS/GBS.

The width of the pole tip portion 402 of the write pole 314 (e.g. the distance between the sides 410) is one of the key parameters that defines the track width "TW" of the magnetic write head. This track width is preferably reduced in order to increase the data density of the magnetic recording system. The manufacture of a write pole 314 involves certain photolithographic patterning and ion milling operations or reactive ion etch processes. In general, a layer of write pole material (such as a laminate of high magnetic moment magnetic material and thin non-magnetic layers) is deposited as a continuous film. Then, a mask is formed over the write pole material, the mask generally having the shape of the desired write pole. Then, a material removal process, such as ion milling, is performed to remove portions of the write pole material that are not protected by the mask to define the write pole.

Figure 5:
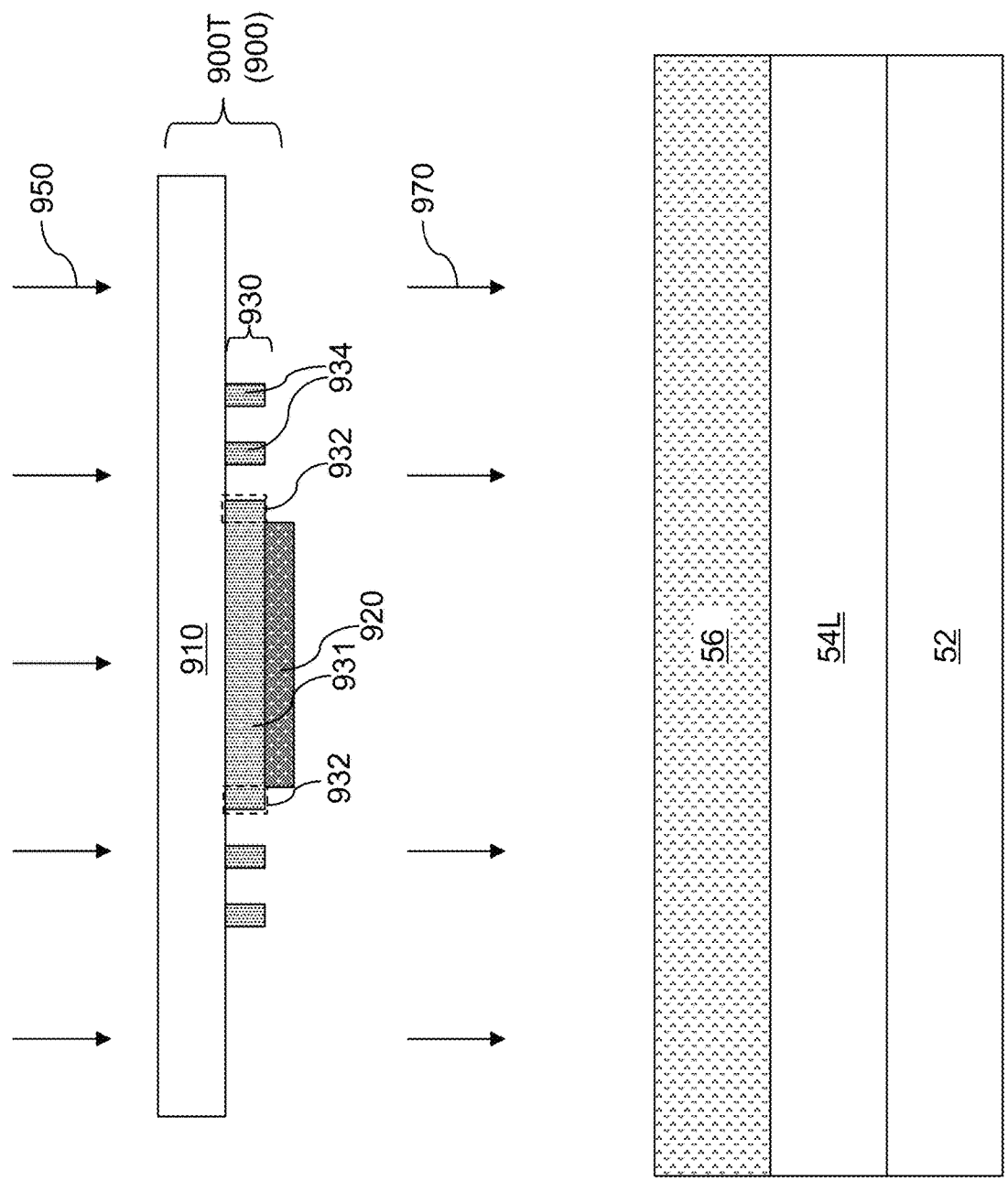
FIG. 5 is a schematic vertical cross-sectional view of an exemplary structure including a lithographic mask and a layer stack under lithographic exposure according to an embodiment of the present disclosure.
Figure 6:
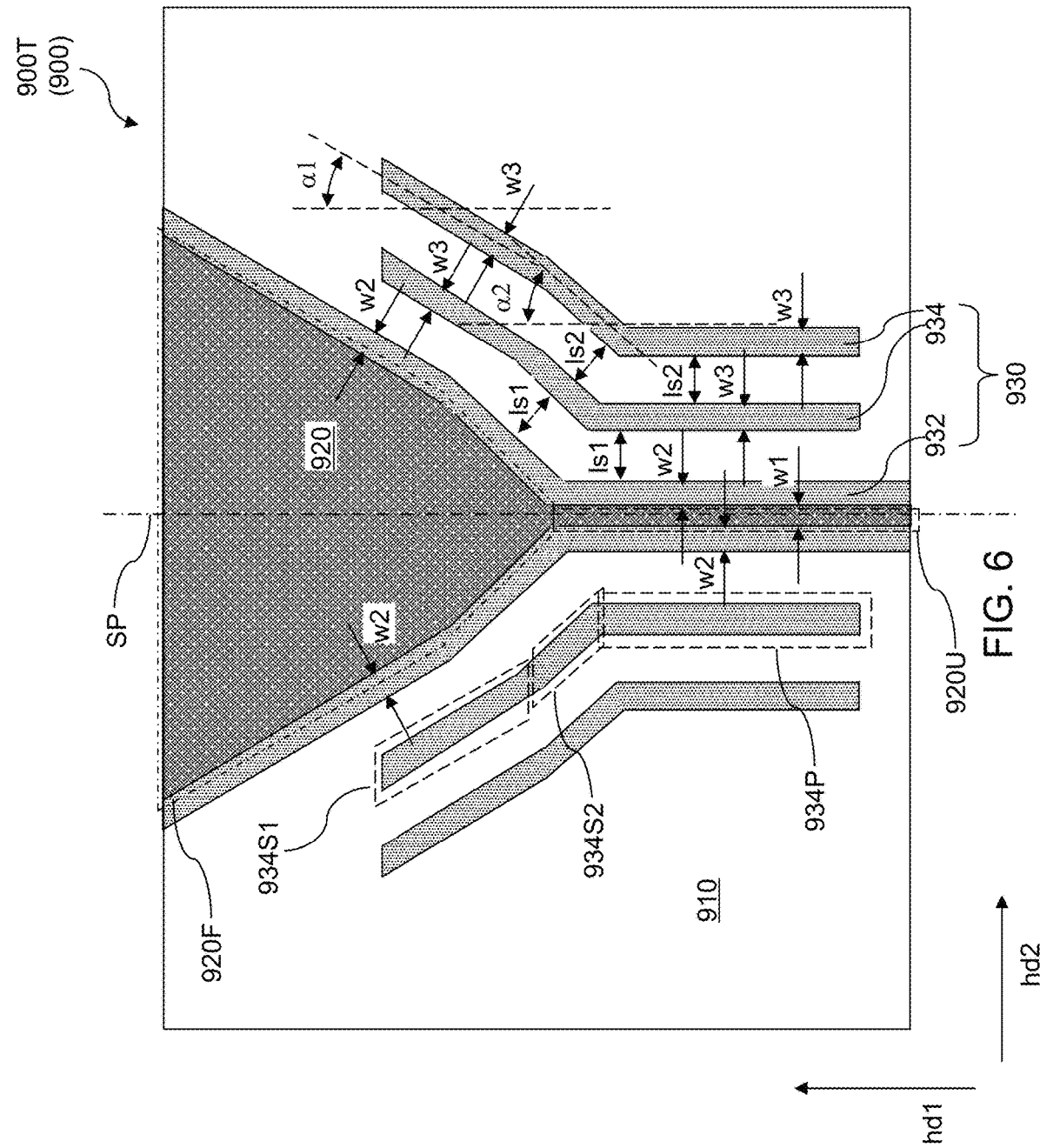
FIG. 6 is a plan view of the lithographic mask in the exemplary structure of FIG. 5.

Referring to FIGS. 5 and 6, an exemplary structure for forming a write pole according to an embodiment of the present disclosure is illustrated during lithographic illumination during a lithographic exposure process. FIG. 5 is a schematic vertical cross-sectional view of an exemplary structure including a lithographic mask 900 and a layer stack (52, 54L, 56) under lithographic exposure according to an embodiment of the present disclosure. FIG. 6 is a plan view of the lithographic mask 900 in the exemplary structure of FIG. 5.

Generally, a substrate 52 including suitable patterned structures can be provided. The patterned structures may include components of a write head 166 other than a write pole 314. Generally, the components embedded within the substrate 52 may include first portions of a write coil 322 that underlies the write pole 314 during a manufacture process. Second portions of the write coil 322 can be formed after patterning the write pole 314.

A magnetic material layer 54L can be formed over the substrate 52. In one embodiment, the magnetic material layer 54L may be part of stack or laminate which includes a high magnetic moment magnetic material layer 54L and thin non-magnetic layers (not shown for clarity). The magnetic material layer 54L is subsequently patterned into a write pole 314. As such, the magnetic material layer 54L includes a magnetic material that is suitable for the write pole 314. Additional laminate material layers (not shown) may be optionally formed over the magnetic material layer. In an illustrative example, the additional laminate material layers may comprise, from bottom to top, a carbon layer, a polyimide layer, and/or a silicon oxide layer as described in U.S. Pat. No. 7,565,732 B2. A mask, such as a photoresist layer 56 can be formed over the magnetic material layer 54L and any additional laminate material layers (if present). The photoresist layer 56 may comprise, for example, deep ultraviolet (DUV) photoresist material.

The stack of the substrate 52, the magnetic material layer 54L, and the photoresist layer 56 can be loaded into a lithographic exposure tool, and a lithographic mask 900 can be positioned over the photoresist layer 56. Generally, the lithographic mask 900 can be disposed over the photoresist layer 56 by placing the substrate 52 and material layers thereabove in a lithographic exposure tool. An illumination beam (i.e., a radiation beam, such as a deep UV radiation beam) 950 can be irradiated onto the lithographic mask 900 with a suitable illumination scheme from above the lithographic mask 900, and a transmitted beam (i.e., the radiation beam) 970 can proceed from the lithographic mask 900 toward the photoresist layer 56 to lithographically expose the photoresist layer 56 within a lithographic pattern. In one embodiment, the illumination beam comprises a multipole illumination beam, such as a QUAdrupole Shaped AnnulaR (QUASAR™) multipole illumination beam provided from a ArF laser illuminator module available from ASML. In some embodiments, the photoresist layer 56 may be a positive photoresist layer in which un-linking of a cross-linked polymer material occurs upon irradiation with the transmitted beam, and physically exposed portions of the material of the photoresist layer 56 are subsequently removed upon lithographic development.

According to an aspect of the present disclosure, the lithographic mask 900 comprises a tri-tone mask 900T including a patterned opaque material layer 920 and a patterned partially-transparent material layer 930 located on a transparent substrate 910. As used herein, the term "transparent" means the material transmits more than 70% of the illumination beam (e.g., a deep UV radiation beam), the term "opaque" means that the material transmits less than 2% (e.g., 0% to 0.2%) of the illumination radiation beam, and the term "partially-transparent" means that the material transmits more of the illumination radiation beam than the opaque material but less than the transparent material (i.e., has a transmissivity between that of the opaque and transparent materials for the illumination beam). In one embodiment, the patterned opaque material layer 920 blocks at least 99.8% of incident illumination radiation during lithographic exposure of the photoresist layer 56. In one embodiment, the patterned partially-transparent material layer 930 blocks 90% to 98%, such as 93% to 95% of the incident illumination radiation (i.e., transmits 2% to 10%, such as 5% to 7%, for example about 6% of the incident illumination radiation) during the lithographic exposure of the photoresist layer 56.

In one embodiment, the patterned opaque material layer 920 comprises chromium, the patterned partially-transparent material layer 930 comprises molybdenum silicide, and the transparent substrate 910 comprises glass or quartz.

As shown in FIG. 6, the patterned opaque material layer 920 comprises a uniform width region 920U extending along a lengthwise direction and having a first uniform width (such as a first width w1) and a flare region 920F adjoined to a first end of the uniform width region 920U and having a variable lateral dimension along a direction that is perpendicular to the lengthwise direction of the uniform width region 920U. For example, the lengthwise direction of the uniform width region 920U may be a first horizontal direction hd1, and the widthwise direction of the uniform width region 920 may be a second horizontal direction hd2 that is perpendicular to the first horizontal direction hd1.

The patterned partially-transparent material layer 930 comprises a pair of partially-transparent strips 932 extending adjacent to a respective edge of the patterned opaque material layer 920, and partially-transparent assist bars 934 that are laterally spaced from the pair of partially-transparent strips 932. In one embodiment, the pair of partially-transparent strips 932 comprise edge regions of a portion 931 of patterned partially-transparent material layer 930 that is located over the transparent substrate 910. The patterned opaque material layer 920 is located over the portion 931 of the patterned partially-transparent material layer 930, such that the pair of partially-transparent strips 932 (i.e., the edge regions of the portion 931 of layer 930) are not covered by the patterned opaque material layer 920.

In one embodiment, each of the partially-transparent assist bars 934 comprises a respective parallel segment 934P that is parallel to the lengthwise direction of the uniform width region 920U (e.g., the first horizontal direction hd1) and a respective slanted segment (934S1, 934S2) that is parallel to a respective edge of the flare region 920F. In one embodiment, each of the slanted segments (934S1, 934S2) of the partially-transparent assist bars 934 laterally extends along a respective direction that is at a fixed or variable angle ($\alpha 1$, $\alpha 2$) with respective to the lengthwise direction of the uniform width region 920U of the patterned opaque material layer 920. In one embodiment, the fixed or variable angle ($\alpha 1$, $\alpha 2$) may be in a range from 20 degrees to 60 degrees.

In some embodiments, a partially-transparent assist bar 934 may have a plurality of slanted segments (934S1, 934S2) such as the first slanted segment 934S1 and the second slanted segment 934S2. The first slanted segment 934S1 may extend along a horizontal direction that is at a first angle $\alpha 1$ with respect to the lengthwise direction of the uniform width region 920U (such as the first horizontal direction hd1), and the second slanted segment 934S2 may extend along a horizontal direction that is at a second angle $\alpha 2$ with respect to the lengthwise direction of the uniform width region 920U. The second angle $\alpha 2$ may be greater than the first angle $\alpha 1$.

While the partially-transparent assist bars 934 in the embodiment of FIG. 6 each comprise a first slanted segment 934S1 and a second slanted segment 934S2, embodiments are expressly contemplated herein in which a partially-transparent assist bar 934 comprises three of more slanted segments extending along a respective horizontal direction having different taper angles with respect to the lengthwise direction of the uniform width region 920.

In one embodiment, the fixed or variable angle ($\alpha 1$, $\alpha 2$) may be a variable angle ($\alpha 1$, $\alpha 2$) that decreases with a distance, either continuously or stepwise, from a second end of the uniform width region 920U that is distal from the flare region 920F along a direction that is parallel to the lengthwise direction of the uniform width region 920U. The second end of the uniform width region 920U is the opposite end of the first end of the uniform width region 920U that is adjoined to the flare region 920F.

In one embodiment, the partially-transparent assist bars 934 comprise a set of two or more first partially-transparent assist bars 934 located on a first side of the patterned opaque material layer 920, and a set of two or more second partially-transparent assist bars 934 located on a second side of the patterned opaque material layer 920 and laterally spaced from the first set of two or more first partially-transparent assist bars 934 by the patterned opaque material layer 920. In one embodiment, a pattern of the set of two or more first partially-transparent assist bars 934 and a pattern of the set of two or more second partially-transparent assist bars 934 may have a mirror symmetry with respect to a vertical plane, which is a symmetry plane SP, that passes through a geometrical center of the patterned opaque material layer 920 along the a lengthwise direction of the uniform width region 920U (i.e., along the first horizontal direction hd1).

In one embodiment, each of the pair of partially-transparent strips 932 may have a second uniform width, which is also referred to as a uniform strip width (such as a second width w2). In one embodiment, the second uniform width (such as the second width w2) may be in a range from 100% to 200% of the first uniform width (such as the first width w1).

In one embodiment, each of the partially-transparent assist bars 934 has a respective uniform bar width (such as a third width w3) that is in a range from 75% to 125% of a width w2 of each partially-transparent strip 932 within the pair of partially-transparent strips 932. In one embodiment, the uniform bar width (such as the third width w3) may be the same as the second uniform width (such as the second width w2).

In one embodiment, the set of two or more first partially-transparent assist bars 934 may comprise a first inner partially-transparent assist bar 934 (e.g., the right side inner bar in FIG. 6) that is most proximal to the partially-transparent strip 932 (e.g., the right side strip in FIG. 6) on the same side of the plane SP. The first inner partially-transparent assist bar 934 may be laterally spaced from the partially-transparent strip 932 by a uniform lateral spacing (such as a first lateral spacing ls1) that is in a range from 150% to 500% of the uniform bar width (such as a third width w3) of each of the partially-transparent assist bars 934.

Furthermore, the set of two or more second partially-transparent assist bars 934 may comprise a second inner partially-transparent assist bar 934 (e.g., the left side inner bar in FIG. 6) that is most proximal to the partially-transparent strip 932 (e.g., the left side strip in FIG. 6) on the same side of the plane SP. The second inner partially-transparent assist bar 934 is laterally spaced from the partially-transparent strip 932 by a uniform lateral spacing (such as the first lateral spacing ls1) that is in a range from 150% to 500% of the uniform bar width (such as the third width w3) of each of the partially-transparent assist bars 934.

In one embodiment, a lateral spacing (such as a second lateral spacing ls2) between a neighboring pair of first partially-transparent assist bars 934 (e.g., right side bars in FIG. 6) within the set of two or more first partially-transparent assist bars 934 is in a range from 150% to 500% of the uniform bar width (such as a third width w3) of each of the partially-transparent assist bars 934. Likewise, a lateral spacing (such as the second lateral spacing ls2) between a neighboring pair of second partially-transparent assist bars 934 (e.g., left side bars in FIG. 6) within the set of two or more second partially-transparent assist bars 934 is in a range from 150% to 500% of the uniform bar width (such as the third width w3) of each of the partially-transparent assist bars 934.

In one embodiment, each neighboring pair of first partially-transparent assist bars 934 within the set of two or more first partially-transparent assist bars 934 (e.g., right side bars in FIG. 6) may be laterally spaced apart from each other by a respective uniform lateral spacing (such as the second lateral spacing ls2). Likewise, each neighboring pair of second partially-transparent assist bars 934 (e.g., left side bars in FIG. 6) within the set of two or more second partially-transparent assist bars 934 may be laterally spaced apart from each other by a respective uniform lateral spacing (such as the second lateral spacing ls2). The second lateral spacing ls2 may be in a range from 80% to 125% of the first lateral spacing ls1. In one embodiment, the second lateral spacing ls2 may be the same as the first lateral spacing ls1.

According to an aspect of the present disclosure, a tri-tone lithographic mask 900 comprising a patterned opaque material layer 920 and a patterned partially-transparent material layer 930 located on a transparent substrate 910 is provided. The patterned opaque material layer 920 comprises a uniform width region 920U extending along a lengthwise direction and having a first uniform width and a flare region 920F adjoined to a first end of the uniform width region 920U and having a variable lateral dimension along a direction that is perpendicular to the lengthwise direction of the uniform width region 920U. The patterned partially-transparent material layer 930 comprises a pair of partially-transparent strips 932 extending adjacent to a respective edge of the patterned opaque material layer 920, and partially-transparent assist bars 934 that are laterally spaced from the pair of partially-transparent strips 932. Each of the partially-transparent assist bars 934 comprises a respective parallel segment 934P that is parallel to the lengthwise direction of the uniform width region 920U and a respective slanted segment (934S1, 934S2) that is parallel to a respective edge of the flare region 920F.

Figure 7B:
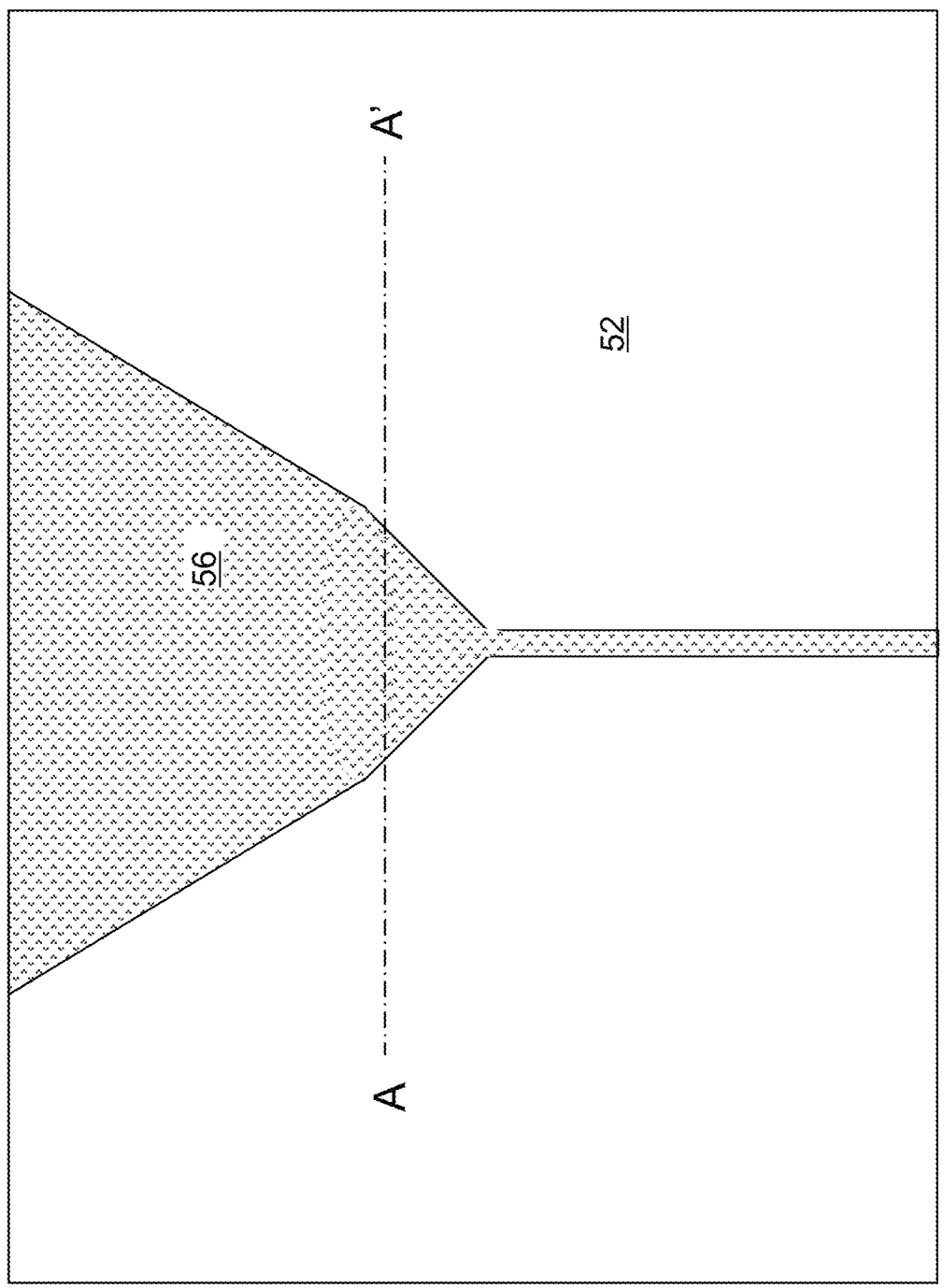
FIG. 7B is a top-down view of the exemplary structure along the vertical plane A-A' of FIG. 7A.

Referring to FIGS. 7A and 7B, a lithographic development process can be performed to develop the photoresist layer 56. In case the photoresist layer 56 comprises a positive photoresist layer, the lithographically exposed portions of the photoresist layer 56 can be removed during the development process.

The pattern in the photoresist layer 56 can be subsequently transferred through the optional additional laminate material layers (not illustrated) and the magnetic material layer 54L. Any known pattern transfer processes known in the art may be employed. For example, an anisotropic etch process may be performed to transfer the pattern in the photoresist layer into the additional laminate material layers and the photoresist layer 56 may be removed, for example, by ashing. An ion milling process may be employed to transfer the pattern in the additional laminate material layers through the magnetic material layer 54L. A patterned remaining portion of the magnetic material layer 54L comprises a write pole 314. Alternative pattern transfer methods may also be employed to pattern the magnetic material layer 54L into at least one write pole 314.

Generally, the photoresist layer 56 can be lithographically exposed employing the lithographic mask 900, and can be subsequently developed. The magnetic material layer 54L can be patterned into a write pole 314 for a hard disk drive by removing portions of the magnetic material layer 54L that are not covered by the photoresist layer 56 by performing at least one pattern transfer process.

According to an aspect of the present disclosure, the write pole 314 has a pattern that replicates a pattern of a combination of the patterned opaque material layer 920 and the pair of partially-transparent strips 932 and does not include any pattern that replicates a pattern of the partially-transparent assist bars 934. Generally, the radiation dose of the lithographic exposure process is selected such that the pattern of the partially-transparent assist bars 934 is not replicated in the photoresist layer 56. As such, the partially-transparent assist bars 934 function as sublithographic assist features that do not form its own image in the photoresist layer 56.

In one embodiment, the write pole 314 comprises a uniform-width write pole portion having a uniform pole width. The uniform pole width is greater than the first uniform width of the uniform width region 920U (i.e., the first width w1). Generally, the partially-transparent strips 932 have a relatively high opacity such that the edges of the uniform-width write pole portion of the write pole 314 corresponds more to the outer edges of the straight regions of the partially-transparent strips 932 that laterally extend along the lengthwise direction of the uniform width region 920U, than to the edges of the uniform width region 920U that laterally extend along the lengthwise direction of the uniform width region 920U of the tri-tone lithographic mask 900T.

In one embodiment, the uniform pole width is in a range from a sum of the first uniform width (i.e., the first width w1) and a second uniform width (i.e., the second width w2) of one of the pair of partially-transparent strips 932 to a sum of the first uniform width (i.e., the first width w1) of the patterned opaque material layer 920 and three times the second uniform width (i.e., the second width w2).

Figure 8D:
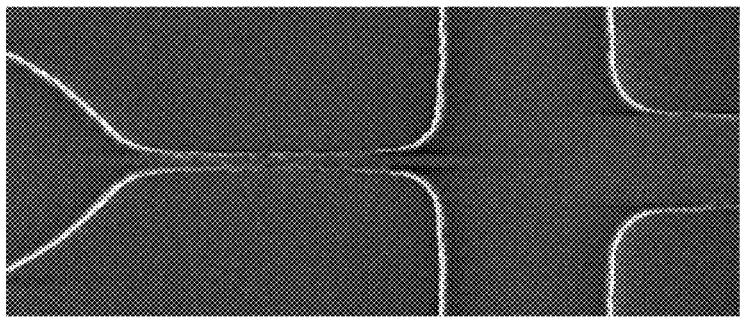
FIGS. 8A-8D are scanning electron micrographs of samples of the exemplary structure after lithographic development according to an embodiment of the present disclosure.
Figure 8C:
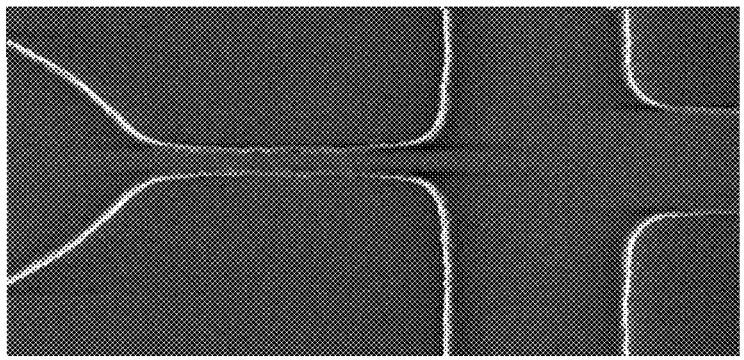
Figure 8B:
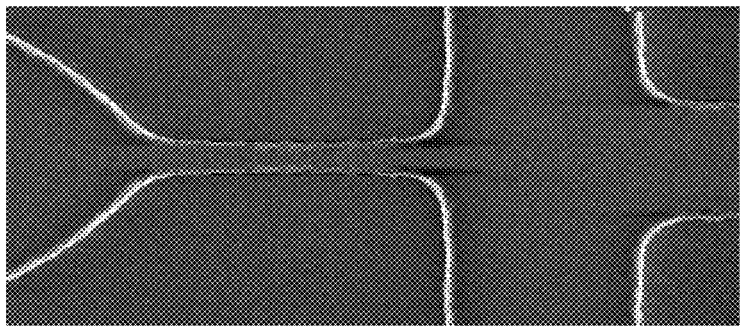
Figure 8A:
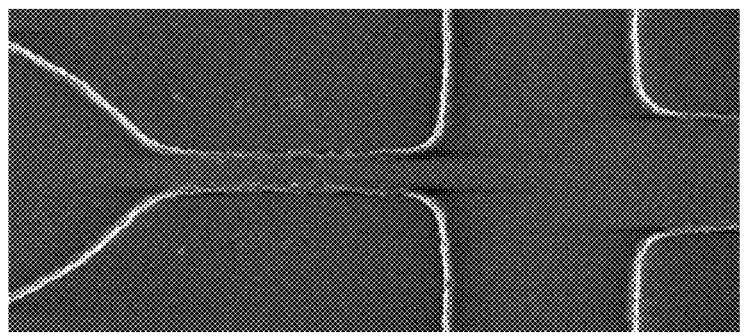

FIGS. 8A-8D are scanning electron micrographs of samples of the exemplary structure after lithographic development according to an embodiment of the present disclosure. The lithographic exposure conditions for the scanning electron micrographs of FIGS. 8A-8D differ by the dose of lithographic exposure. FIG. 8A corresponds to the condition of a dose of 31 mJ; FIG. 8B corresponds to the condition of a dose of 34 mJ; FIG. 8C corresponds to the condition of a dose of 43 mJ; and FIG. 8D corresponds to the condition of a dose of 70 mJ. The first width w1 was 40 nm, and the second width w2 was 60 nm for the tri-tone lithographic mask employed to generate the samples for the scanning electron micrographs. Generally, formation of very narrow straight features adjoined to a flare region is possible over a wide range of lithographic doses for the inventive method of the present disclosure.

Figure 9:
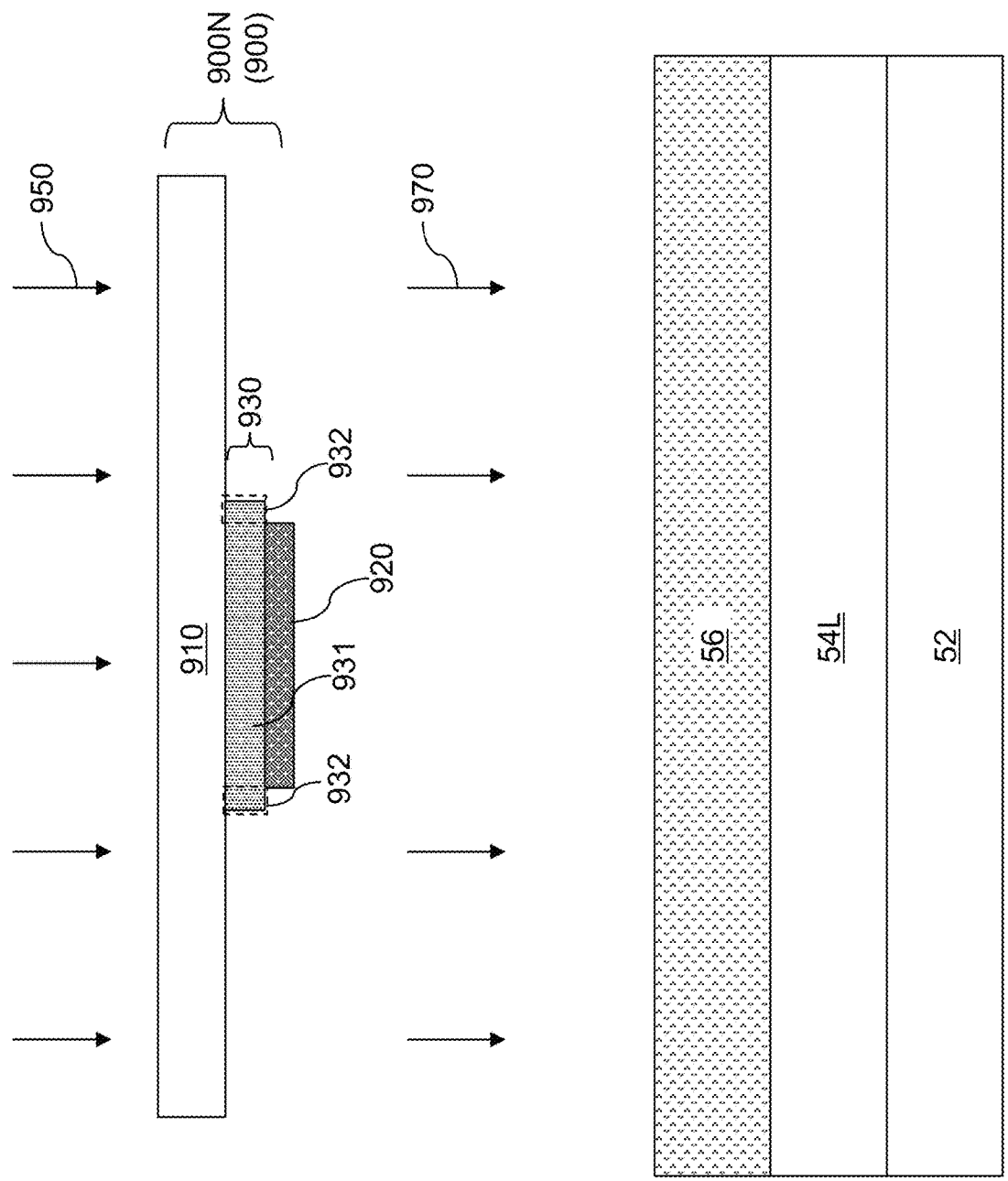
FIG. 9 is a schematic vertical cross-sectional view of a comparative exemplary structure including a lithographic mask and a layer stack under lithographic exposure.
Figure 10:
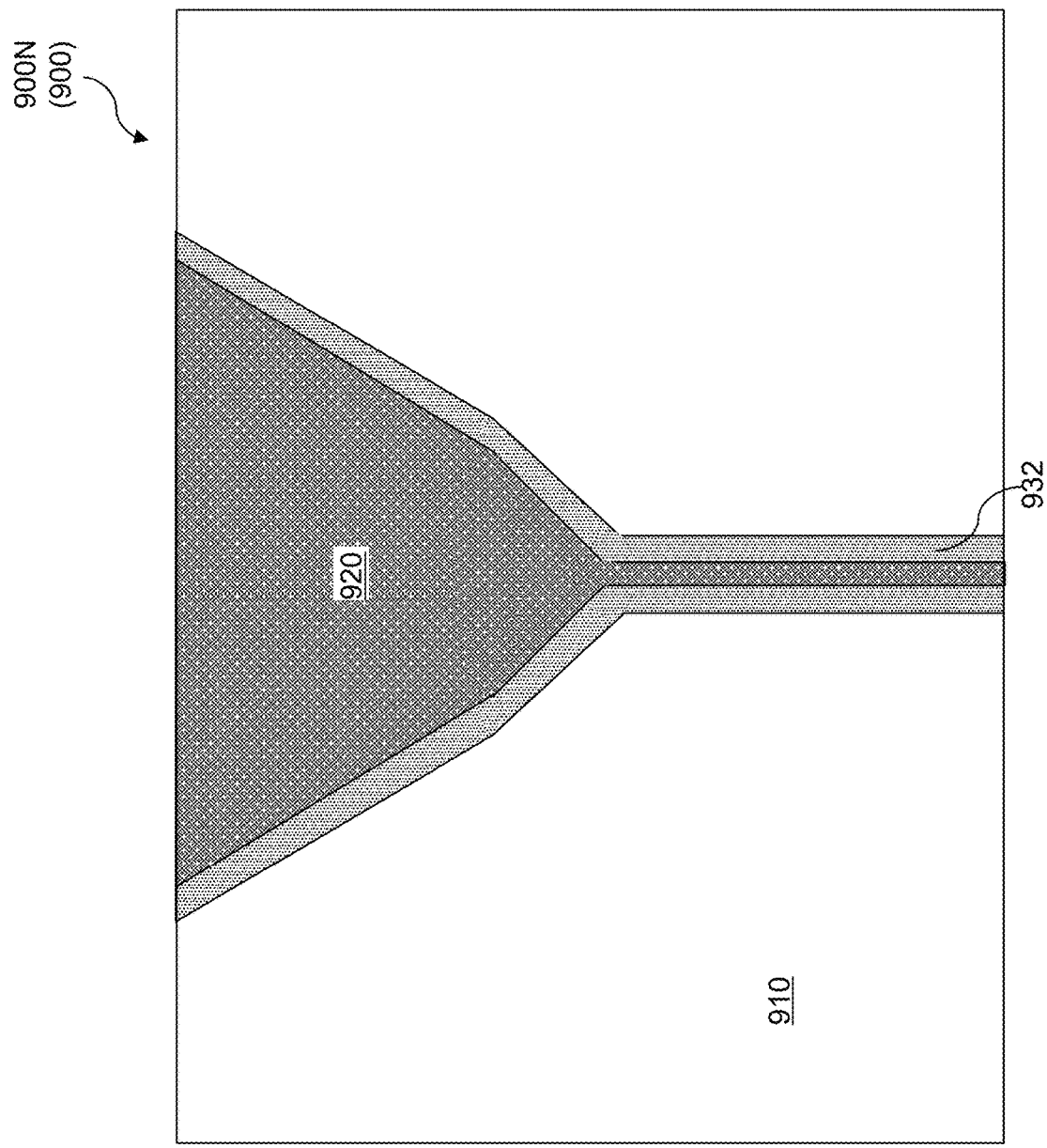
FIG. 10 is a plan view of the lithographic mask in the comparative exemplary structure of FIG. 9.

FIG. 9 is a schematic vertical cross-sectional view of a comparative exemplary structure including a lithographic mask 900 and a layer stack under lithographic exposure. The comparative exemplary structure employs an assist-less lithographic mask 900N as the lithographic mask. FIG. 10 is a plan view of the assist-less lithographic mask 900N in the exemplary structure of FIG. 9. The assist-less lithographic mask 900N of FIG. 10 may be derived from the tri-tone lithographic mask 900T of FIG. 6 by omitting the partially-transparent assist bars 934.

Figure 11D:
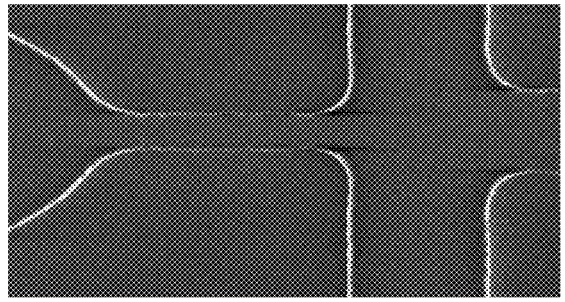
FIGS. 11A-11D are scanning electron micrographs of samples of the exemplary structure after lithographic development according to an embodiment of the present disclosure.
Figure 11C:
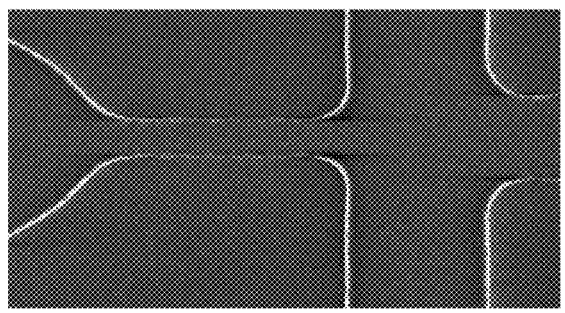
Figure 11B:
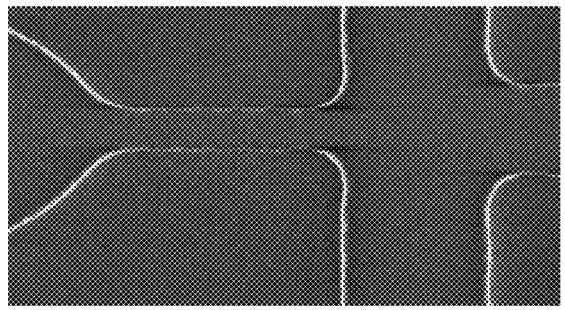
Figure 11A:
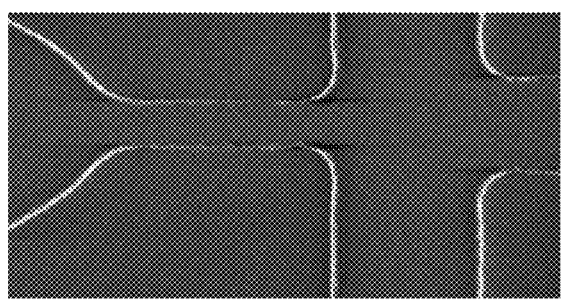

FIGS. 11A-11D are scanning electron micrographs of samples of the comparative exemplary structure of FIG. 9 after lithographic development according to an embodiment of the present disclosure. The lithographic exposure conditions for the scanning electron micrographs of FIGS. 11A-11D differ by the dose of lithographic exposure. FIG. 11A corresponds to the condition of a dose of 31 mJ; FIG. 11B corresponds to the condition of a dose of 46 mJ; FIG. 11C corresponds to the condition of a dose of 64 mJ; and FIG. 11D corresponds to the condition of a dose of 70 mJ. The first width w1 was 90 nm, and the second width w2 was 50 nm for the lithographic mask employed to generate the samples for the scanning electron micrographs. Generally, the line portions having a uniform width are formed with significantly greater widths than the widths observed in the scanning electron micrographs of FIGS. 8A-8D. Simulations indicate that modifications of the first width w1 and/or the second width w2 does not achieve much better results than shown in the scanning electron micrographs of FIGS.

11A-11D in case the comparative assist-less lithographic mask 900N of FIG. 10 is employed.

Figure 12:
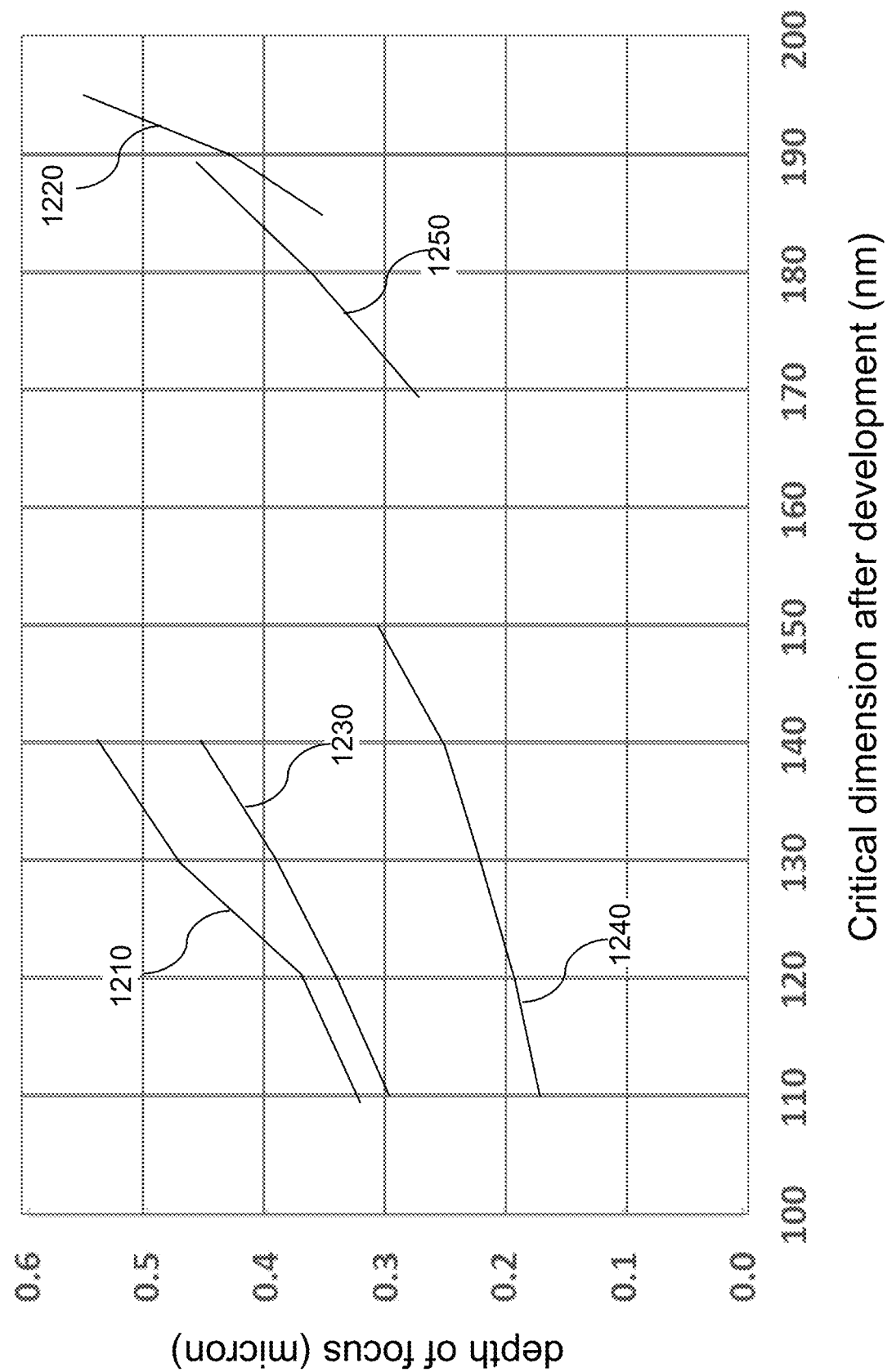
FIG. 12 is a graph illustrating the depth of focus as a function of a lithographic critical dimension for various lithographic processes.

FIG. 12 is a graph illustrating the depth of focus as a function of a lithographic critical dimension for various lithographic processes. Generally, the greater the depth of focus, the greater the process window and the greater the ease of control for the lithographic exposure process in terms of the focus control. Typically, a depth of focus of at least 0.3 microns is desired for a stable lithographic exposure process. A first curve 1210 shows the depth of focus for a first tri-tone lithographic mask 900T of the embodiment of the present disclosure having a first width w1 of 40 nm and a second width w2 of 60 nm to provide a nominal target line width of 160 nm (which equals w1+2×w2) in case quadrupole shaped annular multipole illumination beam is employed during the lithographic exposure process. A second curve 1220 shows the depth of focus for a second tri-tone lithographic mask 900T of the present disclosure having a first width w1 of 90 nm and a second width w2 of 50 nm to provide a nominal target line width of 190 nm (which equals w1+2×w2) in case a conventional illumination is employed during the lithographic exposure process. A third curve 1230 shows the depth of focus for a first conventional two-tone lithographic mask (i.e., including a single opaque layer) having a width of 150 nm in a line portion in case the quadrupole shaped annular multipole illumination beam is employed during the lithographic exposure process. A fourth curve 1240 shows the depth of focus for a second conventional two-tone lithographic mask (i.e., including a single opaque layer) having a width of 150 nm in a line portion in case a conventional illumination is employed during the lithographic exposure process. A fifth curve 1250 shows the depth of focus for a third conventional two-tone lithographic mask (i.e., including a single opaque layer) having a width of 200 nm in a line portion in case a conventional illumination is employed during the lithographic exposure process. Comparison of the values of the depth of focus for the various lithographic masks show that the tri-tone lithographic masks 900T of the present disclosure provide a higher value for the depth of focus at the target critical dimension compared to the various conventional lithographic masks for both conventional (e.g., monopole) and the quadrupole shaped annular multipole illumination beams.

Figure 13:
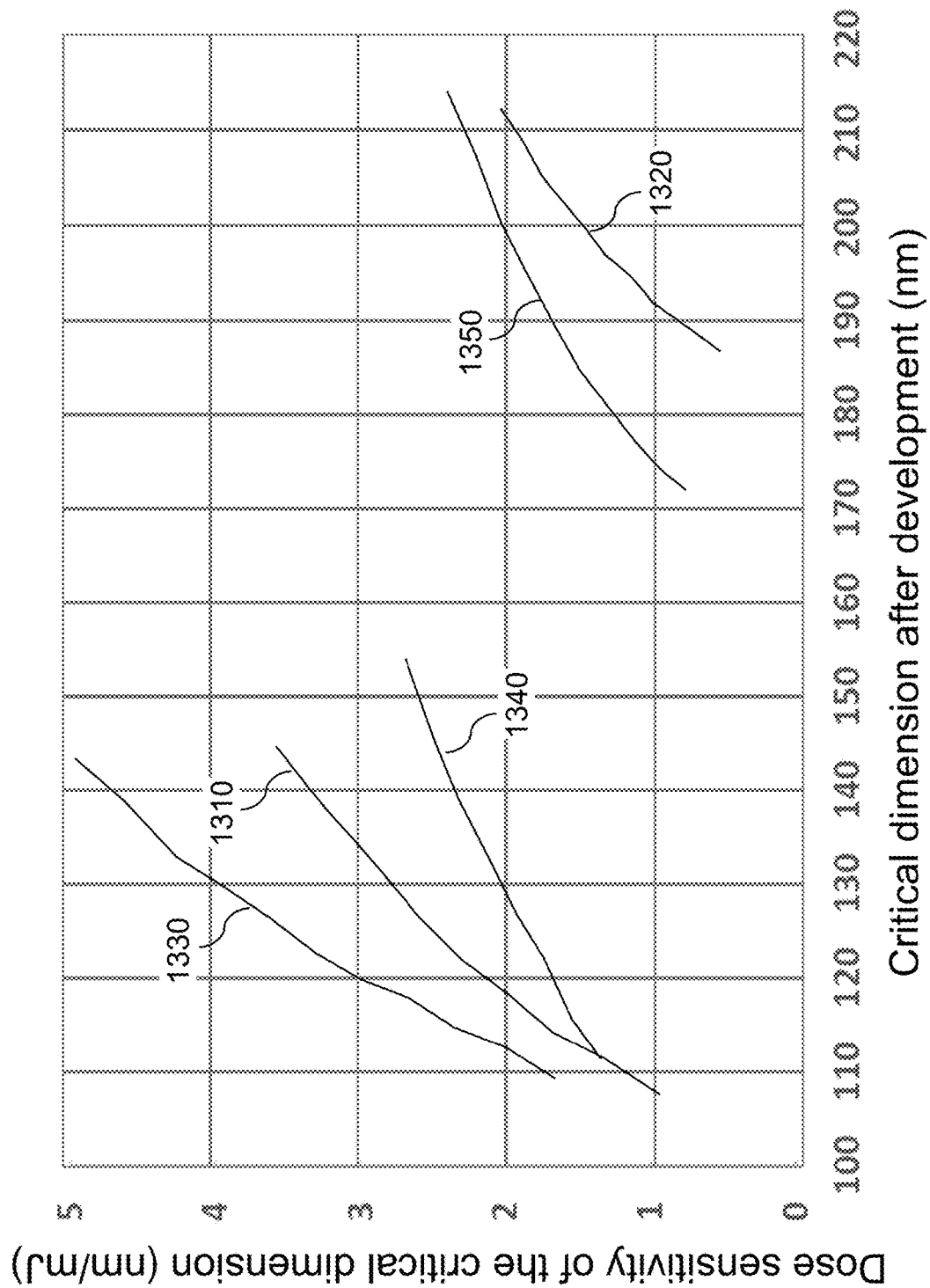
FIG. 13 is a graph illustrating the dose sensitivity of a lithographic critical dimension as a function of a nominal lithographic critical dimension for various lithographic processes.

FIG. 13 is a graph illustrating the dose sensitivity (i.e., the rate of change of a lithographic critical dimension per unit change in the dose during a lithographic exposure process) as a function of a nominal lithographic critical dimension for various lithographic processes. Generally, the smaller the dose sensitivity, the more stable the lithographic exposure process with respect to variations in the lithographic dose, and the easier the control of the lithographic process in terms of a dose control. A first curve 1310 shows the dose sensitivity for the first tri-tone lithographic mask 900T of the embodiment of the present disclosure having a first width w1 of 40 nm and a second width w2 of 60 nm to provide a nominal target line width of 160 nm (which equals w1+2× w2) in case the quadrupole shaped annular multipole illumination beam is employed during the lithographic exposure process. A second curve 1320 shows the dose sensitivity for the second tri-tone lithographic mask 900T of the embodiment of the present disclosure having a first width w1 of 90 nm and a second width w2 of 50 nm to provide a nominal target line width of 190 nm (which equals w1+2×w2) in case a conventional illumination is employed during the lithographic exposure process. A third curve 1330 shows the dose sensitivity for the first conventional two-tone lithographic mask (i.e., including a single opaque layer) having a width of 150 nm in a line portion in case the quadrupole shaped annular multipole illumination beam is employed during the lithographic exposure process. A fourth curve 1340 shows the dose sensitivity for the second conventional two-tone lithographic mask (i.e., including a single opaque layer) having a width of 150 nm in a line portion in case a conventional illumination is employed during the lithographic exposure process. It should be noted that the fourth curve 1240 in FIG. 12 shows an unacceptably small depth of focus for the second conventional two-tone lithographic mask. Thus, the small dose sensitivity shown by the fourth curve 1340 does not make the second conventional two-tone lithographic mask better than the tri-tone lithographic mask 900T of the embodiments of the present disclosure. A fifth curve 1350 shows the dose sensitivity for the third conventional two-tone lithographic mask (i.e., including a single opaque layer) having a width of 200 nm in a line portion in case a conventional illumination is employed during the lithographic exposure process. Comparison of the values of the dose sensitivity for the various lithographic masks show that the tri-tone lithographic masks 900T of the embodiments of the present disclosure provide lower dose sensitivity above 180 nm for the critical dimension than a conventional lithographic mask, and provide on-par performance or better performance in the critical dimension range from 110 nm to 150 nm compared to various conventional lithographic masks.

The tri-tone lithographic mask 900T of the embodiments of the present disclosure can provide better lithographic performance compared to various comparative exemplary lithographic masks through the lithographic interference generated by the partially-transparent strips 932 and the partially-transparent assist bars 934. A write pole 314 having a narrower straight portion can be manufactured employing the tri-tone lithographic mask 900T of the embodiments of the present disclosure, a disk drive providing enhanced performance may be manufactured.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a write pole of a write head of a hard disk drive, comprising:
  forming a photoresist layer over a magnetic material layer located over a substrate;
  disposing a lithographic mask comprising a tri-tone mask including a patterned opaque material layer and a patterned partially-transparent material layer located over a transparent substrate, wherein the patterned opaque material layer comprises a uniform width region extending along a lengthwise direction and having a first uniform width, and a flare region adjoined to a first end of the uniform width region and having a variable lateral dimension along a direction that is perpendicular to the lengthwise direction of the uniform width region, wherein the patterned partially-transparent material layer comprises a pair of partially-transparent strips extending adjacent to a respective edge of the patterned opaque material layer, and partially-transparent assist bars that are laterally spaced from the pair of partially-transparent strips;

lithographically exposing the photoresist layer through the lithographic mask;

developing the photoresist layer to form a patterned photoresist layer; and patterning the magnetic material layer into the write pole by removing portions of the magnetic material layer that are not covered by the patterned photoresist layer.

2. The method of claim 1, wherein each of the partially-transparent assist bars comprises a respective parallel segment that is parallel to the lengthwise direction of the uniform width region and a respective slanted segment that is parallel to a respective edge of the flare region.

3. The method of claim 2, wherein each of the slanted segments of the partially-transparent assist bars laterally extends along a respective direction that is at a fixed or variable angle with respective to the lengthwise direction of the uniform width region of the patterned opaque material layer, the fixed or variable angle being in a range from 20 degrees to 60 degrees.

4. The method of claim 3, wherein the fixed or variable angle is the variable angle that decreases with a distance from a second end of the uniform width region that is distal from the flare region along a direction that is parallel to the lengthwise direction of the uniform width region.

5. The method of claim 1, wherein the write pole has a pattern that replicates a pattern of a combination of the patterned opaque material layer and the pair of partially-transparent strips and does not include any pattern that replicates a pattern of the partially-transparent assist bars.

6. The method of claim 1, wherein the partially-transparent assist bars comprise:

a set of two or more first partially-transparent assist bars located on a first side of the patterned opaque material layer; and a set of two or more second partially-transparent assist bars located on a second side of the patterned opaque material layer and laterally spaced from the first set of two or more first partially-transparent assist bars by the patterned opaque material layer.

7. The method of claim 6, wherein a pattern of the set of two or more first partially-transparent assist bars and a pattern of the set of two or more second partially-transparent assist bars have a mirror symmetry with respect to a vertical plane passing through a geometrical center of the patterned opaque material layer along a lengthwise direction of the uniform width region.

8. The method of claim 6, wherein each of the partially-transparent assist bars has a respective uniform bar width that is in a range from 75% to 125% of a width of each partially-transparent strip within the pair of partially-transparent strips.

9. The method of claim 8, wherein a lateral spacing between a neighboring pair of first partially-transparent assist bars within the set of two or more first partially-transparent assist bars is in a range from 150% to 500% of the uniform bar width of each of the partially-transparent assist bars.

10. The method of claim 9, wherein:

the set of two or more first partially-transparent assist bars comprises a first inner partially-transparent assist bar that is most proximal to an adjacent one of the partially-transparent assist strips; and the first inner partially-transparent assist bar is laterally spaced from the adjacent one of the partially-transparent assist strips by a uniform lateral spacing that is in a range from 150% to 500% of the uniform bar width of each of the partially-transparent assist bars.

11. The method of claim 1, wherein:

the write pole comprises a uniform-width write pole portion having a uniform pole width; and the uniform pole width is greater than a first uniform width.

12. The method of claim 11, wherein the uniform pole width is in a range from a sum of the first uniform width and a second uniform width of one of the pair of partially-transparent strips to a sum of the first uniform width of the patterned opaque material layer and three times the second uniform width.

13. The method of claim 1, wherein:

the patterned opaque material layer blocks at least 99.8% of incident illumination radiation during the step of lithographically exposing the photoresist layer; and the patterned partially-transparent material layer blocks from 90% to 98% of the incident illumination radiation.

14. The method of claim 1, wherein the patterned opaque material layer comprises chromium, and the patterned partially-transparent material layer comprises molybdenum silicide.

15. The method of claim 1, wherein the step of lithographically exposing the photoresist layer comprises exposing the photoresist layer to a quadrupole shaped annular ultraviolet radiation beam.

16. A tri-tone lithographic mask comprising a patterned opaque material layer and a patterned partially-transparent material layer located over a transparent substrate, wherein:

the patterned opaque material layer comprises a uniform width region extending along a lengthwise direction and having a first uniform width and a flare region adjoined to a first end of the uniform width region and having a variable lateral dimension along a direction that is perpendicular to the lengthwise direction of the uniform width region;

the patterned partially-transparent material layer comprises a pair of partially-transparent strips extending adjacent to a respective edge of the patterned opaque material layer, and partially-transparent assist bars that are laterally spaced from the pair of partially-transparent strips; and each of the partially-transparent assist bars comprises a respective parallel segment that is parallel to the lengthwise direction of the uniform width region and a respective slanted segment that is parallel to a respective edge of the flare region.

17. The tri-tone lithographic mask of claim 16, wherein each of the slanted segments of the partially-transparent assist bars laterally extends along a respective direction that is at a fixed or variable angle with respective to the lengthwise direction of the uniform width region of the patterned opaque material layer, the fixed or variable angle being in a range from 20 degrees to 60 degrees.

18. The tri-tone lithographic mask of claim 17, wherein the fixed or variable angle is the variable angle that decreases with a distance from a second end of the uniform width region that is distal from the flare region along a direction that is parallel to a lengthwise direction of the uniform width region.

19. The tri-tone lithographic mask of claim 16, wherein the partially-transparent assist bars comprise:
- a set of two or more first partially-transparent assist bars located on a first side of the patterned opaque material layer; and
- a set of two or more second partially-transparent assist bars located on a second side of the patterned opaque material layer and laterally spaced from the first set of two or more first partially-transparent assist bars by the patterned opaque material layer.

20. The tri-tone lithographic mask of claim 16, wherein:
the patterned opaque material layer comprises chromium;
the patterned partially-transparent material layer comprises molybdenum silicide; and
the transparent substrate comprises glass or quartz.

* * * * *